(12) United States Patent
Rhee et al.

(10) Patent No.: US 11,716,839 B2
(45) Date of Patent: Aug. 1, 2023

(54) SEMICONDUCTOR DEVICES

(71) Applicant: Samsung Electronics Co., Ltd., Suwon-si (KR)

(72) Inventors: Joonkyu Rhee, Hwaseong-si (KR); Jiyoung Ahn, Seoul (KR); Hyunyong Kim, Daegu (KR); Jamin Koo, Hwaseong-si (KR); Yongseok Ahn, Seoul (KR); Minsub Um, Suwon-si (KR); Sangho Lee, Seoul (KR); Yoonyoung Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 17/357,139

(22) Filed: Jun. 24, 2021

(65) Prior Publication Data

US 2022/0149048 A1    May 12, 2022

(30) Foreign Application Priority Data

Nov. 9, 2020    (KR) .......................... 10-2020-0148747

(51) Int. Cl.
 *H10B 12/00*    (2023.01)
(52) U.S. Cl.
 CPC .......... *H10B 12/315* (2023.02); *H10B 12/34* (2023.02)
(58) Field of Classification Search
 None
 See application file for complete search history.

(56) References Cited

U.S. PATENT DOCUMENTS

| 9,209,241 | B2 | 12/2015 | Kim et al. | |
| 9,419,002 | B2 | 8/2016 | Han et al. | |
| 9,824,726 | B2* | 11/2017 | Han | G11C 5/063 |
| 10,074,656 | B1 | 9/2018 | Wang et al. | |
| 10,622,249 | B2 | 4/2020 | Yoon | |
| 10,672,773 | B2 | 6/2020 | Ji et al. | |
| 2016/0267949 | A1* | 9/2016 | Han | H01L 27/10885 |
| 2018/0174971 | A1* | 6/2018 | Song | H01L 27/10888 |
| 2019/0067294 | A1* | 2/2019 | Lee | H01L 27/10888 |
| 2019/0206873 | A1* | 7/2019 | Kim | H01L 27/10855 |
| 2020/0194439 | A1 | 6/2020 | Kim et al. | |
| 2020/0203354 | A1* | 6/2020 | Lee | H01L 27/10814 |

\* cited by examiner

*Primary Examiner* — Steven M Christopher
(74) *Attorney, Agent, or Firm* — Harness, Dickey & Pierce, P.L.C.

(57) ABSTRACT

A semiconductor device includes an active pattern on a substrate, a gate structure buried at an upper portion of the active pattern, a bit line structure on the active pattern, a lower spacer structure covering a lower sidewall of the bit line structure, a contact plug structure on the active pattern and adjacent to the bit line structure, and a capacitor on the contact plug structure. The lower spacer structure includes first and second lower spacers that are sequentially stacked from the lower sidewall of the bit line structure in a horizontal direction that is substantially parallel to an upper surface of the substrate, the first lower spacer includes an oxide, and contacts the lower sidewall of the bit line structure, but does not contact the contact plug structure, and the second lower spacer includes a material different from any of the materials of the first lower spacer.

20 Claims, 19 Drawing Sheets

SEMICONDUCTOR DEVICES

CROSS-REFERENCE TO RELATED APPLICATION

This application claims priority under 35 U.S.C. § 119 to Korean Patent Application No. 10-2020-0148747 filed on Nov. 9, 2020 in the Korean Intellectual Property Office, the disclosure of which is hereby incorporated by reference in its entirety.

BACKGROUND

Some example embodiments of inventive concepts relate to a semiconductor device. More particularly, some example embodiments of inventive concepts relate to a DRAM device including a bit line structure.

A bit line structure of a dynamic random access memory (DRAM) device has a stacked structure including a first conductive pattern containing doped polysilicon and a second conductive pattern containing a metal. The bit line structure may contact an active pattern through a recess on the active pattern, so as to be electrically connected to the active pattern, and a lower portion of a spacer structure on a sidewall of the bit line structure may be formed in/within the recess. If the bit line structure has a narrow width, current might not flow through the bit line structure and/or a resistance may be high, so that the bit line structure should have a proper width. However, increasing the width of the bit line structure may have a limitation due to the size of the recess.

SUMMARY

Some example embodiments provide a semiconductor device having improved characteristics such as improved electrical characteristics and/or improved ease of manufacturability.

According to some example embodiments of inventive concepts, there is provided a semiconductor device. The semiconductor device may include an active pattern on a substrate, a gate structure buried at an upper portion of the active pattern, a bit line structure on the active pattern, a lower spacer structure covering a lower sidewall of the bit line structure, a contact plug structure on the active pattern and adjacent to the bit line structure, and a capacitor on the contact plug structure. The lower spacer structure includes first and second lower spacers that are sequentially stacked from the lower sidewall of the bit line structure in a horizontal direction that is substantially parallel to an upper surface of the substrate, the first lower spacer includes an oxide, and contacts the lower sidewall of the bit line structure, but does not contact the contact plug structure, and the second lower spacer includes a material different from any of the materials of the first lower spacer.

According to some example embodiments of inventive concepts, there is provided a semiconductor device. The semiconductor device may include an active pattern on a substrate, a gate structure buried at an upper portion of the active pattern, a bit line structure on the active pattern, the bit line structure including a first conductive pattern, a diffusion barrier, a second conductive pattern, and a capping pattern that are sequentially stacked in a vertical direction that is substantially perpendicular to an upper surface of the substrate, a lower spacer structure covering a sidewall of at least a portion of the first conductive pattern of the bit line structure, an upper spacer structure on the lower spacer structure, the upper spacer structure covering a sidewall of other portions of the bit line structure, a contact plug on the active pattern and adjacent to the bit line structure, and a capacitor on the contact plug. The first conductive pattern includes polysilicon having n-type impurities, and the second conductive pattern includes a metal, the lower spacer structure includes first and second lower spacers that are sequentially stacked from the sidewall of the at least a portion of the first conductive pattern in a horizontal direction that is substantially parallel to an upper surface of the substrate, the first lower spacer includes an oxide, and covers the sidewall of the at least a portion of the first conductive pattern, but does not contact the contact plug, the second lower spacer includes a nitride, and contacts the contact plug, and the sidewall of the other portions of the bit line structure includes a nitride.

According to some example embodiments of inventive concepts, there is provided a semiconductor device. The semiconductor device may include an active pattern on a substrate, a gate structure buried at an upper portion of the active pattern, the gate structure extending in a first direction substantially that is parallel to an upper surface of the substrate, a bit line structure extending in a second direction and contacting the active pattern on a recess on a central upper surface of the active pattern, the second direction being substantially parallel to the upper surface of the substrate and substantially perpendicular to the first direction, the bit line structure including a first conductive pattern, a diffusion barrier, a second conductive pattern, and a capping pattern that are sequentially stacked in a vertical direction that is substantially perpendicular to the upper surface of the substrate, a lower spacer structure covering a sidewall of at least a portion of the first conductive pattern of the bit line structure, the lower spacer structure including first and second lower spacers that are sequentially stacked in a horizontal direction that is substantially parallel to the upper surface of the substrate, an upper spacer structure covering a sidewall of a portion of the bit line structure not covered by the lower spacer structure, the upper spacer structure including first, second, and third upper spacers that are sequentially stacked in the horizontal direction, a contact plug structure on a corresponding one of opposite ends of the active pattern, the contact plug structure including a lower contact plug, an ohmic contact pattern, a barrier layer and an upper contact plug sequentially stacked in the vertical direction; and a capacitor on the contact plug structure. The first lower spacer includes an oxide, and contacts the sidewall of the at least a portion of the first conductive pattern, but does not contact the contact plug structure, and the second lower spacer includes a material different from any of the materials of the first lower spacer.

In the semiconductor device, currents may easily or more easily flow in the bit line structure and/or a resistance may be reduced, and thus the semiconductor device including the bit line structure may have enhanced electrical characteristics.

DETAILED DESCRIPTION OF SOME EXAMPLE EMBODIMENTS

The above and other aspects and features of a method of cutting a fine pattern, a method of forming active patterns using the same, and/or a method of manufacturing/fabricating a semiconductor device using the same in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second or third element, component, region, layer or section without departing from the teachings of inventive concepts.

Figure 1:
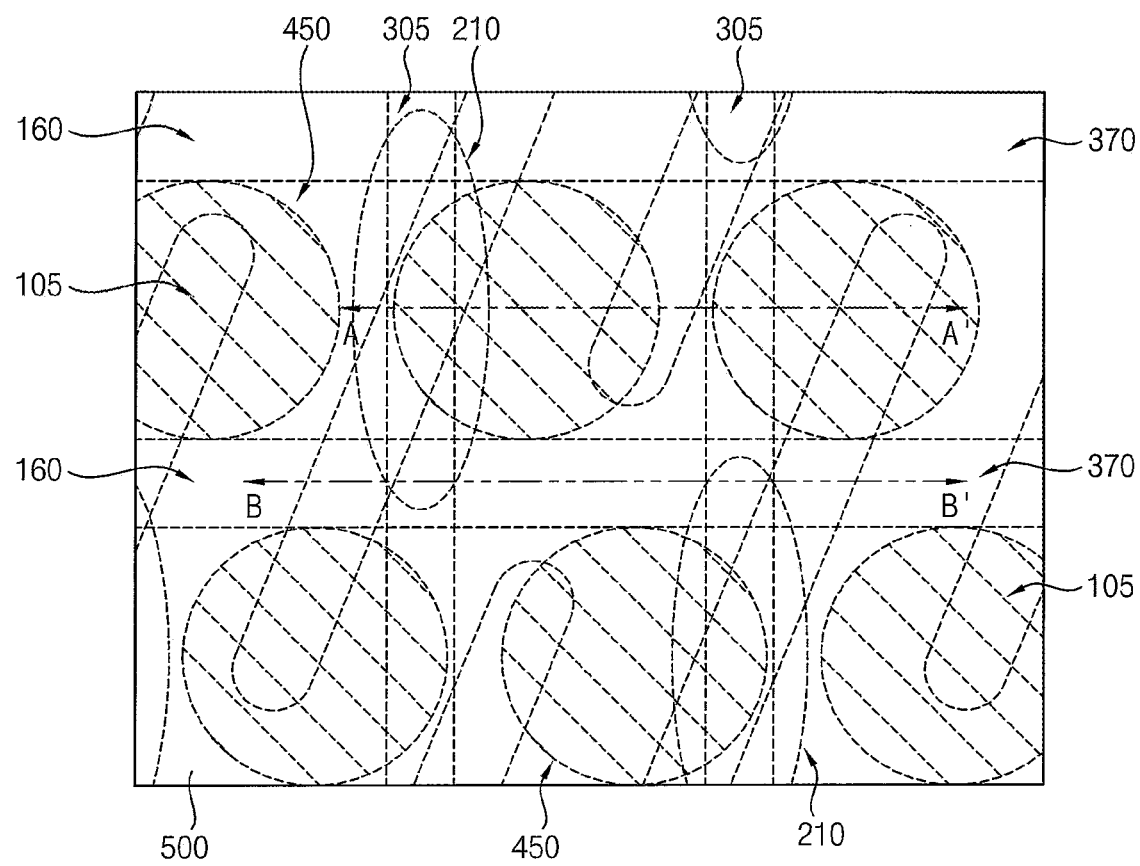
FIGS. 1 and 2 are a plan view and a cross-sectional view illustrating a semiconductor device in accordance with some example embodiments.
Figure 1:
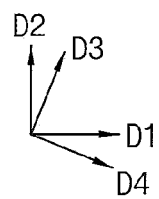
Figure 2:
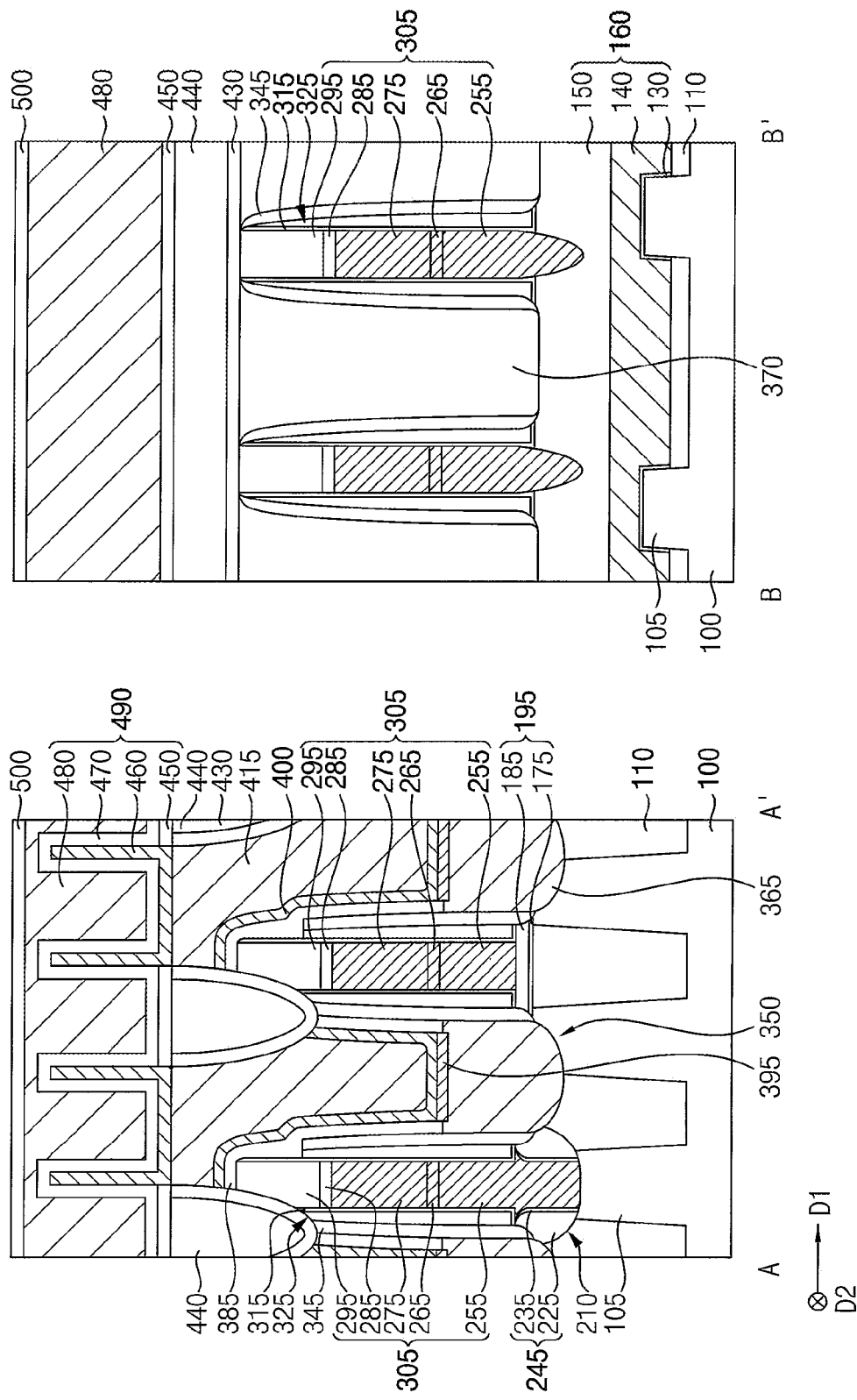

FIGS. 1 and 2 are a plan view and a cross-sectional view, respectively, illustrating a semiconductor device in accordance with some example embodiments. FIG. 2 includes cross-sections taken along lines A-A' and B-B' of FIG. 1.

Hereinafter, in descriptions of some example embodiments (but not necessarily in the claims), two directions substantially parallel to an upper surface of a substrate 100 and substantially perpendicular to each other may be referred to as first and second directions, respectively, a direction substantially parallel to the upper surface of the substrate 100 and having an acute angle (less than ninety degrees) with respect to the first and second directions may be referred to as a third direction, and a direction substantially parallel to the upper surface of the substrate 100 and substantially perpendicular to the third direction may be referred to as a fourth direction. An angle between the first direction and the third direction may be more than forty-five degrees, such as fifty degrees, fifty-five degrees, sixty degrees, sixty-five degrees, seventy degrees, or seventy-five degrees; however, example embodiments are not limited thereto.

Referring to FIGS. 1 and 2, the semiconductor device may include a gate structure 160 (e.g. a word line structure or a row structure), a bit line structure 305 (e.g. a column structure), a contact plug structure, a lower spacer structure 245, an upper spacer structure, and a capacitor 490. Additionally, the semiconductor device may include a third capping pattern 370, an insulation pattern structure 195, an etch stop layer 450, and first to third insulating interlayers 430, 440, and 500.

The substrate 100 may include at least one of silicon, germanium, silicon-germanium, or a III-V group compound semiconductor, such as GaP, GaAs, or GaSb, and may have single-crystalline or polycrystalline phase. The substrate 100 may be undoped, or may be lightly doped, e.g. with boron. In some example embodiments, the substrate 100 may be or include a silicon-on-insulator (SOI) substrate or a germanium-on-insulator (GOI) substrate.

An isolation pattern 110 may be formed on the substrate 100, and an active pattern 105 of which a sidewall is covered by the isolation pattern 110 may be defined on the substrate 100. The isolation pattern 110 may include an oxide, e.g., silicon oxide, and may be formed with a shallow-trench isolation process; however, example embodiments are not limited thereto.

In some example embodiments, a plurality of active patterns 105 may be spaced apart from each other in each of the first and second directions, and each of the active patterns 105 may extend in the third direction to a certain length. A plurality of active patterns 105 may be collinear with each other, e.g. collinear with each other in the third direction D3. The active patterns 105 may have a bar shape, or an oval shape, or may have an extension portion when viewed in plan view; however, example embodiments are not limited thereto.

The gate structure 160 may extend in the first direction through upper portions of the active pattern 105 and the isolation pattern 110, and a plurality of gate structures 160 may be spaced apart from each other in the second direction. For example, the gate structure 160 may be buried at upper portions of the active pattern 105 and the isolation pattern 110. The gate structure 160 may include a gate insulation layer 130, a gate electrode 140, and a gate capping pattern/gate mask 150 that are sequentially stacked in a vertical direction substantially perpendicular to the upper surface of the substrate 100.

The gate insulation layer 130 may be formed on a surface of the active pattern 105, e.g. may be grown on the surface of the active pattern, the gate electrode 140 may extend in the first direction on the gate insulation layer 130 and the isolation pattern 110, and the gate mask 150 may cover an upper surface of the gate electrode 140.

The gate insulation layer 130 may be or include an oxide, e.g., silicon oxide, the gate electrode 140 may include a metal, e.g., at least one of doped polysilicon, tungsten, titanium, tantalum, etc., or a metal nitride, e.g., tungsten nitride, titanium nitride, tantalum nitride, etc., and the gate mask 150 may include a nitride, e.g., silicon nitride.

In some example embodiments, the bit line structure 305 may extend in the second direction on the active pattern 105, the isolation pattern 110, and the gate structure 160, and a plurality of bit line structures 305 may be spaced apart from each other in the first direction. In the second recess 210, each of the bit line structures 305 may contact a central portion in the third direction of an upper surface of the active pattern 105 and upper surfaces of the isolation pattern 110 and the gate structure 160 adjacent thereto. A portion of the bit line structure 305 in the second recess 210 may have a bottom surface lower than those of other portions of the bit line structure 305 at an outside of the second recess 210, and the portion of the bit line structure 305 in the second recess 210 may be referred to as a lower portion thereof.

In some example embodiments, the bit line structure 305 may include a first conductive pattern 255, a diffusion barrier 265, a second conductive pattern 275, and first and second capping patterns 285 and 295 that are all sequentially stacked in the vertical direction.

A plurality of first conductive patterns 255 may be spaced apart from each other in each of the first and second directions. For example, most portion of each of the first conductive patterns 255 may be formed in the second recess 210, and a portion thereof may protrude from the second recess 210 upwardly. Thus, a portion of each of the first conductive patterns 255 may form the lower portion of the bit line structure 305. The first conductive pattern 255 may also be formed at an outside of the second recess 210. In some example embodiments, each of the first conductive patterns 255 may include, e.g., polysilicon doped with n-type impurities.

Each of the diffusion barrier 265, the second conductive pattern 275, and the first and second capping patterns 285 and 295 may extend in the second direction on the first conductive pattern 255. The diffusion barrier 265 may include a metal silicon nitride, e.g., titanium silicon nitride (TiSiN), the second conductive pattern 275 may include a metal, e.g., at least one of tungsten, copper, aluminum, titanium, tantalum, etc., and the first and second capping patterns 285 and 295 may include a nitride, e.g., silicon nitride.

The lower spacer structure 245 may be formed in the second recess 210, and may cover the lower portion of the bit line structure 305, that is, a portion of a sidewall in the first direction of the first conductive pattern 255. The lower spacer structure 245 may include second and first lower spacers 235 and 225 that are sequentially stacked in the first direction from a lower sidewall of the bit line structure 305. The second lower spacer 235 may contact the lower sidewall of the bit line structure 305 but might not contact a lower contact plug 365 of the contact plug structure, while the first lower spacer 225 may contact the lower contact plug 365. In some example embodiments, the first lower spacer 225 may contact the active pattern 105 and/or the isolation pattern 110.

In some example embodiments, the second lower spacer 235 may include a material not containing nitrogen, e.g., an oxide such as silicon oxide ($SiO_2$). The first lower spacer 225 may include a material different from any material included in the second lower spacer 235, e.g., a nitride such as silicon nitride. For example the first lower spacer 225 may not include any material included in the second lower spacer 235, and the second lower spacer 235 may not include any material included in the first lower spacer 225.

The upper spacer structure may be formed on each of opposite sidewalls of other portions of the bit line structure 305 except for the lower portion thereof, and thus may extend in the second direction. For example, the lower spacer structure 245 and the upper spacer structure may be sequentially stacked in the vertical direction on the second recess 210.

In some example embodiments, the upper spacer structure may include a first upper spacer 315, an air spacer 325, a third upper spacer 345, and a fourth upper spacer 385 that are sequentially stacked in the first direction on each of opposite sidewalls of the bit line structure 305 in the first direction. The first upper spacer 315 may contact (e.g. directly contact) each of opposite sidewalls in the first direction of the bit line structure 305 except for the lower portion thereof, the air spacer 325 may contact a portion of an outer sidewall of the first upper spacer 315, the third upper spacer 345 may contact an outer sidewall of the air spacer 325, and the fourth upper spacer 385 may contact an upper surface of the second capping pattern 295, an upper surface and an upper outer sidewall of the first upper spacer 315, a top of the air spacer 327, and an upper surface of and an upper outer sidewall of the third upper spacer 345.

However, in an area where the sidewall in the first direction of the bit line structure 305 is covered by the third capping pattern 370, the air spacer 325 and the third upper spacer 345 may be sequentially stacked in the first direction on the outer sidewall of the first upper spacer 315, and the fourth upper spacer 385 might not be formed.

In some example embodiments, uppermost surfaces of the air spacer 325 and the third upper spacer 345 may be lower than (e.g. closer to a surface of the substrate 100 than) an uppermost surface of the first upper spacer 315, and may be higher than an upper surface of the second conductive pattern 275 of the bit line structure 305.

In some example embodiments, the first upper spacer 315 may include a material different from any material included in that of the second lower spacer 235, e.g., a nitride such as silicon nitride. The air spacer 325 may include air such as clean, dry air. The third upper spacer 345 may include a nitride, e.g., silicon nitride. The fourth upper spacer 385 may include a nitride, e.g., silicon nitride, and/or an oxide, e.g., silicon oxide.

The insulation structure including first and second insulation patterns 175 and 185 that are sequentially stacked in the vertical direction may be formed between the bit line structure 305 and portions of the active pattern 105 and the isolation pattern 110 at a region outside of the second recess 210. The second insulation pattern 185 may contact a lower surface of the first upper spacer 315 having a cross-section of an "L" shape or a backward "L" shape.

The first insulation pattern 175 may include a nitride, e.g., silicon nitride and may not include an oxide, and the second insulation pattern 185 may include an oxide, e.g., silicon oxide and may not include a nitride.

The third capping pattern 370 may extend in the first direction to overlap the gate structure 160 in the vertical direction between ones of the bit line structures 305 neighboring in the first direction, and may partially cover an outer sidewall of the upper spacer structure on the sidewall of the bit line structure 305 in the first direction. In some example embodiments, a plurality of third capping patterns 370 may be spaced apart from each other in the second direction. The third capping pattern 370 may include a nitride, e.g., silicon nitride.

The contact plug structure may include the lower contact plug 365, an ohmic contact pattern 395, a barrier layer 400 and an upper contact plug 415 that are sequentially stacked in the vertical direction.

The lower contact plug 365 may be formed on the third recess 350 on the active pattern 105 and the isolation pattern 110 between the bit line structures 305 neighboring in the first direction and the third capping patterns 370 neighboring in the second direction, and may contact/directly contact an outer sidewall of the third upper spacer 345 of the upper spacer structure and a sidewall of each of the third capping patterns 370. Thus, a plurality of lower contact plugs 365 may be formed to be spaced apart from each other in each of the first and second directions. In some example embodiments, the lower contact plug 365 may contact each of opposite ends in the third direction of each of the active patterns 105. In some example embodiments, an uppermost surface of the lower contact plug 365 may be lower than uppermost surfaces of the air spacer 325 and the third upper spacer 345.

The lower contact plug 365 may include, e.g., polysilicon doped with impurities. In some embodiments, an air gap (not shown) may be formed in the lower contact plug 365.

The ohmic contact pattern 395 may be formed on the lower contact plug 365. The ohmic contact pattern 395 may include, e.g., a silicide such as at least one of cobalt silicide (CoSi), nickel silicide (NiSi), etc.

The barrier layer 400 may be formed on an upper surface of the ohmic contact pattern 395 and a sidewall and an upper surface of the fourth upper spacer 385. The barrier layer 400 may include a metal nitride, e.g., at least one of titanium nitride, tantalum nitride, tungsten nitride, etc.

The upper contact plug 415 may be formed on the barrier layer 400. An upper surface of the upper contact plug 415 may be higher than upper surfaces of the bit line structure 305 and the third capping pattern 370.

In some example embodiments, a plurality of upper contact plugs 415 may be formed in each of the first and second directions, and may be spaced apart from each other by the first and second insulating interlayers 430 and 440 sequentially stacked. The first insulating interlayer 430 may partially penetrate through an upper portion of the second capping pattern 295 of the bit line structure 305 and an upper portion of the upper spacer structure on the sidewall of the bit line structure 305. The first insulating interlayer 430 may include an insulation material having low gap-filling characteristics, and the second insulating interlayer 440 may include a nitride, e.g., silicon nitride.

In some example embodiments, the upper contact plugs 415 may be arranged in a honeycomb pattern in a plan view, e.g. in a hexagonal lattice such as a regular hexagonal lattice in plan view. Each of the upper contact plugs 415 may have a shape of a circle, an ellipse, or a polygon such as a regular polygon in a plan view. The upper contact plug 415 may include a low resistance metal, e.g., at least one of tungsten, aluminum, copper, etc.

The capacitor 490 may include a lower electrode 460, a dielectric layer 470, and an upper electrode 480 sequentially stacked on the upper contact plug 415. The lower and upper electrodes 460 and 480 may include the same material, e.g., doped polysilicon and/or a metal. The dielectric layer 470 may include at least one of a silicon oxide, a metal oxide, and/or a nitride such as silicon nitride, a metal nitride, and the metal may include, e.g., aluminum, zirconium, titanium, hafnium, etc. The dielectric layer 470 may include impurities; however, example embodiments are not limited thereto.

The etch stop layer 450 may be formed between the dielectric layer 470 and the first and second insulating interlayers 430 and 440, and may include a nitride, e.g., silicon nitride.

The third insulating interlayer 500 may be formed on the first and second insulating interlayers 430 and 440, and may cover the capacitor 490. The third insulating interlayer 500 may include an oxide, e.g., silicon oxide.

The first conductive pattern 255 in the bit line structure 305 of the semiconductor device may include, e.g., polysilicon doped with n-type impurities such as at least one of phosphorus or arsenic, and the second lower spacer 235 covering at least a portion of the sidewall of the first conductive pattern 255 may not include nitrogen but may include an oxide such as silicon oxide or silicon oxycarbide. If the second lower spacer 235 includes nitrogen, electrons in the first conductive pattern 255 may be trapped in/within the second lower spacer 235, and thus depletion regions may be generated at opposite sides of the first conductive pattern 255. For example, the depletion regions may inhibit current in/along the first conductive pattern 255. Thus, a space in the first conductive pattern 255 through which currents may flow may be reduced so that the currents might not easily flow in the first conductive pattern 255.

However, in some example embodiments, the second lower spacer 235 may or might not include nitrogen, and thus electrons may not be trapped or a reduced number of electrons may be trapped in the second lower spacer 235 so that currents may more easily flow in the first conductive pattern 255.

The second conductive pattern 275 in the bit line structure 305 may include, e.g., a metal, and the first upper spacer 315 covering a portion of the sidewall of the second conductive pattern 275 might not include an oxide but include nitride such as silicon nitride. Thus, the increase of a resistance of the second conductive pattern 275 may be prevented or reduced in likelihood of occurrence.

For example, the second lower spacer 235 may be formed to not include nitrogen on the lower sidewall of the bit line structure 305, and the first upper spacer 315 may be formed to not include an oxide on an upper sidewall of the bit line structure 305. Thus, currents may easily or more easily flow in the bit line structure 305.

FIGS. 3 to 19 are plan views and cross-sectional views illustrating a method of manufacturing a semiconductor device according to some example embodiments. Specifically, FIGS. 3, 5, 11 and 15 are the plan views, and FIGS. 4, 6-10, 12-14 and 16-19 are the cross-sectional views. Each of FIGS. 4, 6-10, 12-14 and 16-19 includes cross-sections taken along lines A-A' and B-B' of a corresponding plan view.

Figure 3:
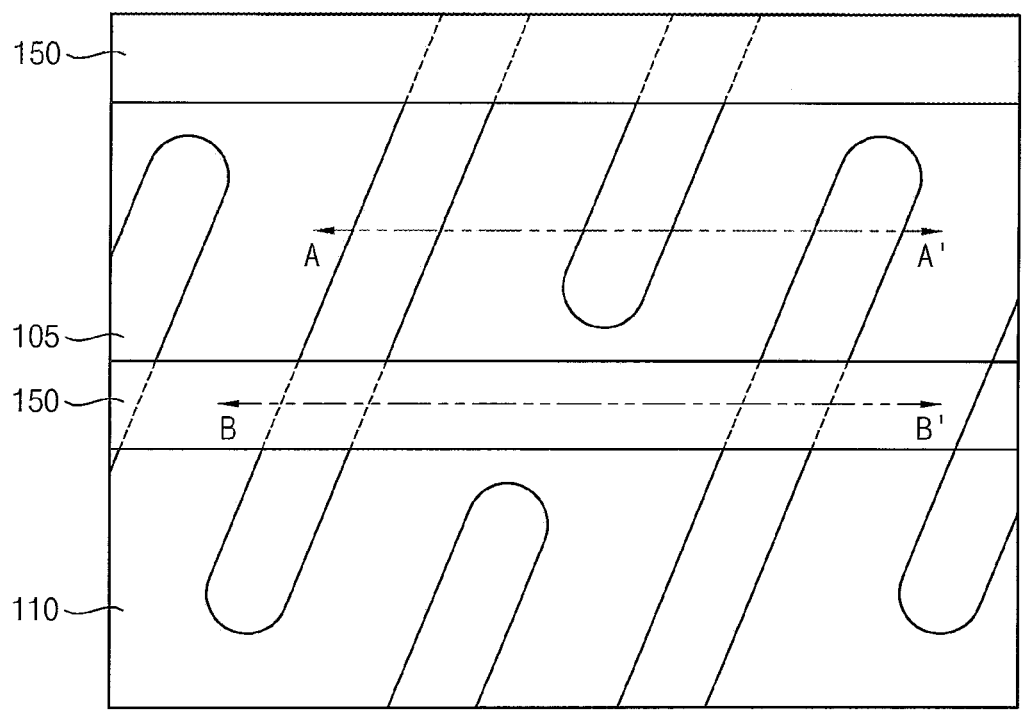
FIGS. 3 to 19 are plan views and cross-sectional views illustrating a method of manufacturing/fabricating a semiconductor device according to some example embodiments.
Figure 3:
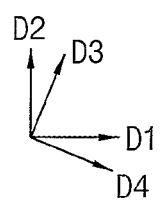
Figure 4:
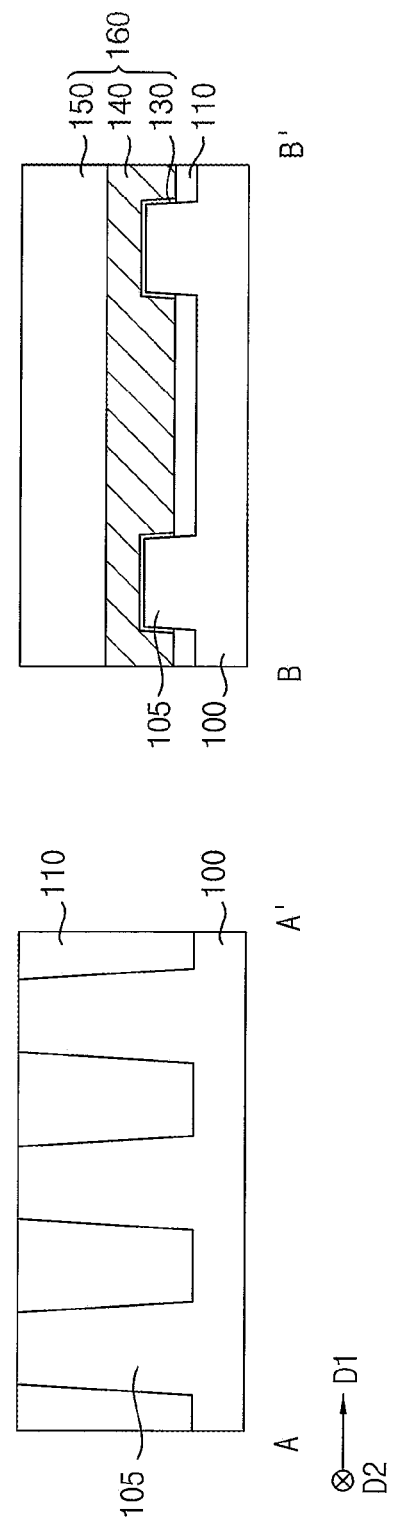

Referring to FIGS. 3 and 4, active patterns 105 may be formed on a substrate 100, and an isolation pattern 110 may be formed to cover sidewalls of the active patterns 105.

An ion implantation process such as a beamline ion implantation process and/or a plasma assisted doping (PLAD) ion implantation process may be performed on the substrate 100 to form an impurity region (not shown), and the active pattern 105 and the isolation pattern 110 may be partially etched to form a first recess extending in the first direction.

A gate structure 160 may be formed in/within the first recess. The gate structure 160 may include a gate insulation layer 130 on a surface of the active pattern 105 exposed by the first recess which may be grown and/or deposited on the surface of the active pattern 105, a gate electrode 140 on the gate insulation layer 130 to fill a lower portion of the first recess, and a gate mask 150 on the gate electrode 140 to fill an upper portion of the first recess. The gate structure 160 may extend in the first direction, and a plurality of gate structures 160 may be spaced apart from each other in the second direction.

In some example embodiments, the gate insulation layer 130 may be formed by performing a thermal oxidation process, e.g. a growth process, on the surface of the active pattern 105 exposed by the first recess, and/or may be formed with an in-situ steam generation (ISSG) process. Alternatively or additionally, the insulation layer 130 may be formed by depositing an insulating material, e.g., silicon oxide on the first recess, using a process such as CVD process and/or an ALD process.

Figure 5:
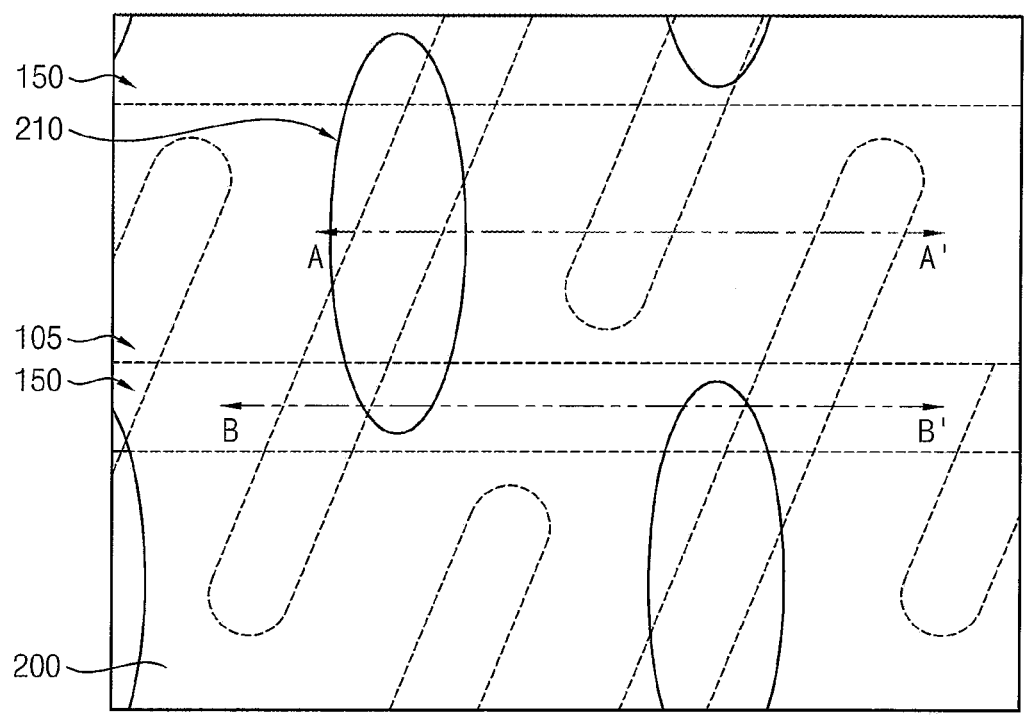
Figure 5:
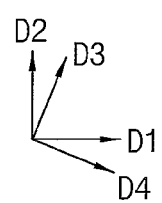
Figure 6:
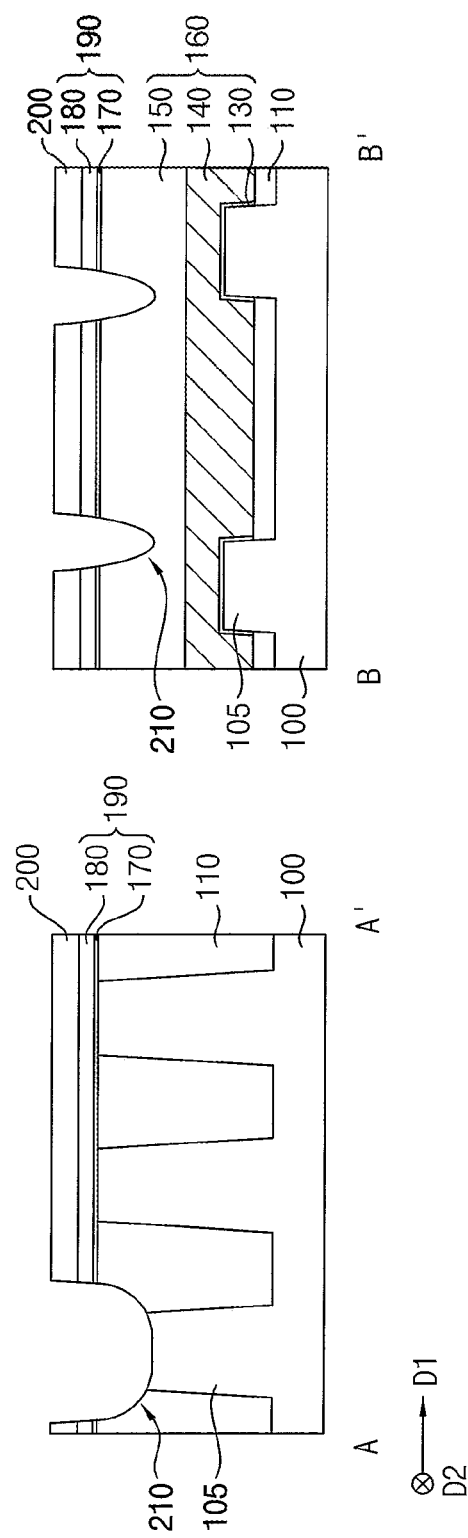

Referring to FIGS. 5 and 6, an insulation layer structure 190 and a first mask 200 may be sequentially formed on the substrate 100, and the insulation layer structure 190 may be etched using the first mask 200 as an etching mask to form a first hole 210 exposing the active pattern 105. The etching of the insulation layer structure 190 may include an anisotropic etch and/or an isotropic etch.

In some example embodiments, the insulation layer structure 190 may include first and second insulation layers 170 and 180 sequentially stacked.

The first mask 200 may include a nitride, e.g., silicon nitride.

During the etching process, upper portions of the active pattern 105 and the isolation pattern 110 adjacent thereto exposed by the first hole 210, and an upper portion of the gate mask 150 may be also etched to form a second recess. For example, a bottom of the first hole 210 may be referred to as a second recess 210.

In some example embodiments, the first hole 210 may expose a central upper surface of each of the active patterns 105 extending in the third direction, and thus a plurality of first holes 210 may be formed in each of the first and second directions.

Figure 7:
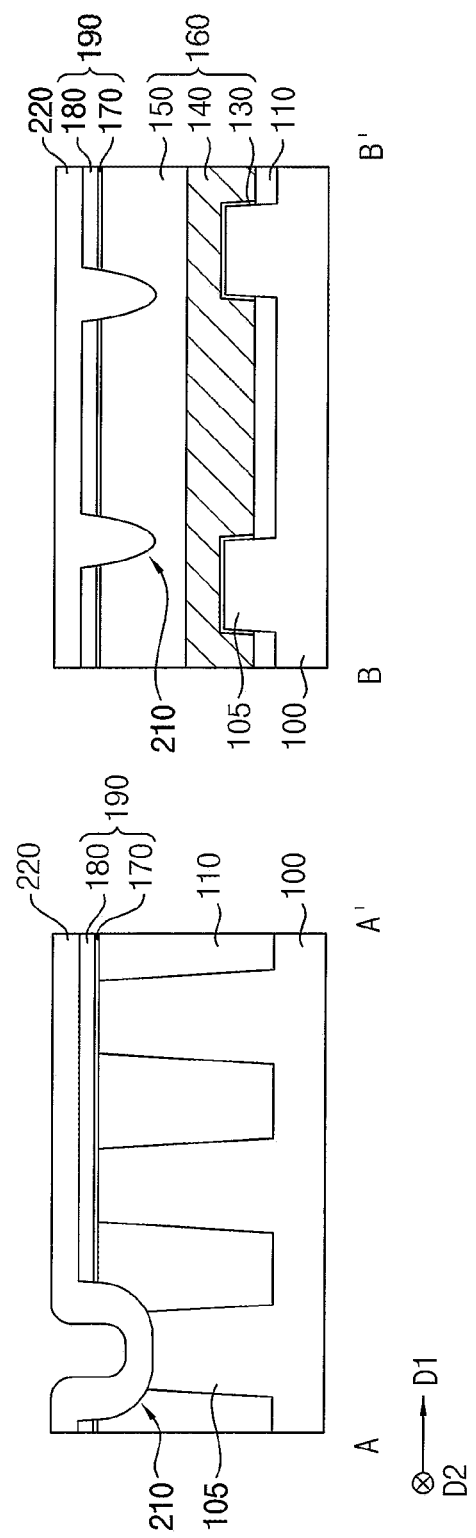

Referring to FIG. 7, after removing the first mask 200, a first lower spacer layer 220 may be formed on the second insulation layer 180 and the first hole 210. The first lower spacer layer 220 may be formed at least partially conformally on the second insulation layer 180 and the first hole 210.

The first lower spacer layer 220 may include, e.g., nitride such as silicon nitride.

Figure 8:
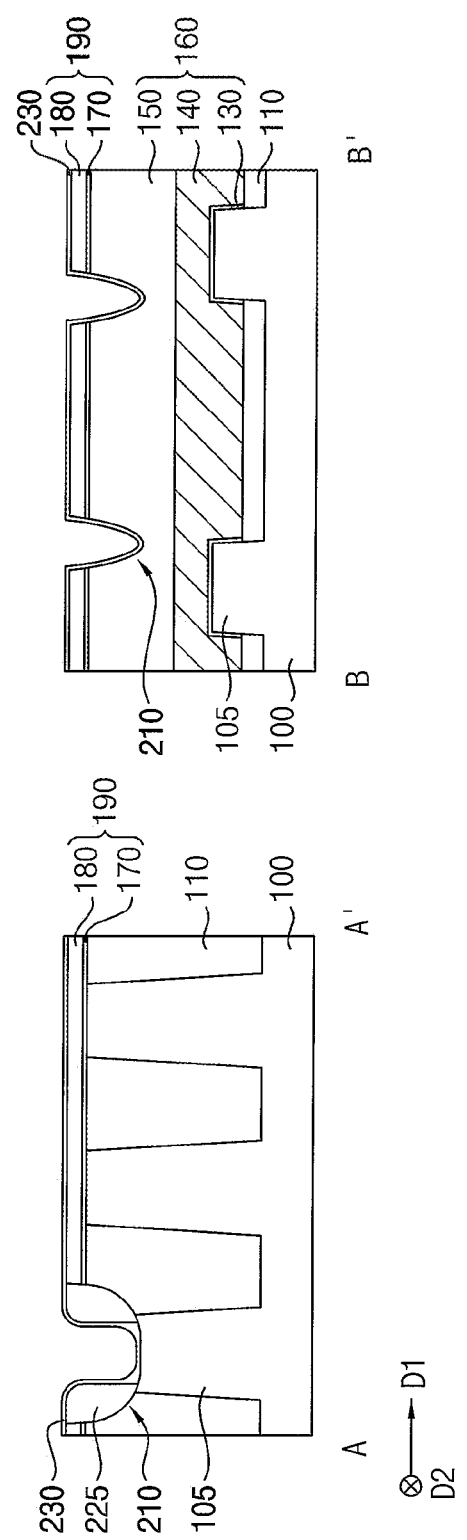

Referring to FIG. 8, the first lower spacer layer 220 may be anisotropically etched to form a first lower spacer 225. The etching of the first lower spacer layer 220 may be performed with a blanket etch process; however, example embodiments are not limited thereto.

Portions of the first lower spacer layer 220 on an upper surface of the second insulation layer 180 and a central bottom of the first hole 210 may be removed through the anisotropic etching process. Thus, the first lower spacer 225 may be formed on an edge bottom of the first hole 210 to expose a portion of an upper surface of the active pattern 105 under the central bottom of the first hole 210, a portion of an upper surface of the isolation pattern 110, and a portion of an upper surface of the gate mask 150.

A second lower spacer layer 230 may be formed on the active pattern 105, the isolation pattern 110, and the gate mask 150 exposed by the second insulation layer 180, the first lower spacer 225, and the first hole 210.

In some example embodiments, the second lower spacer layer 230 may be formed by an atomic layer deposition (ALD) process. The second lower spacer layer 230 may not include nitrogen or may include a material not containing nitrogen, e.g., silicon oxide.

Figure 9:
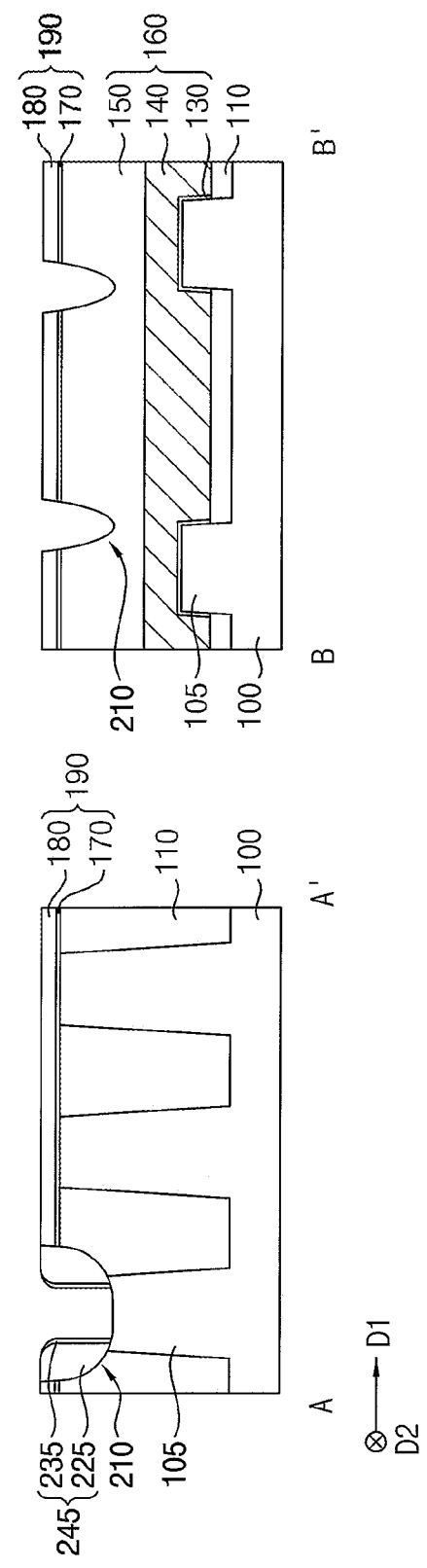

Referring to FIG. 9, the second lower spacer layer 230 may be anisotropically etched to form a second lower spacer 235. The etching of the second lower spacer layer 230 may be performed with a blanket etch process; however, example embodiments are not limited thereto.

Portions of the second lower spacer layer 230 on the upper surface of the second insulation layer 180 and the central bottom of the first hole 210 may be removed through the anisotropic etching process. Thus, the second lower spacer 235 may be formed on the first lower spacer 225 to expose the portion of an upper surface of the active pattern 105 under the central bottom of the first hole 210, the portion of the upper surface of the isolation pattern 110 and the portion of the upper surface of the gate mask 150.

The first and second lower spacers 225 and 235 formed in the first hole 210 may altogether form a lower spacer structure 245.

Figure 10:
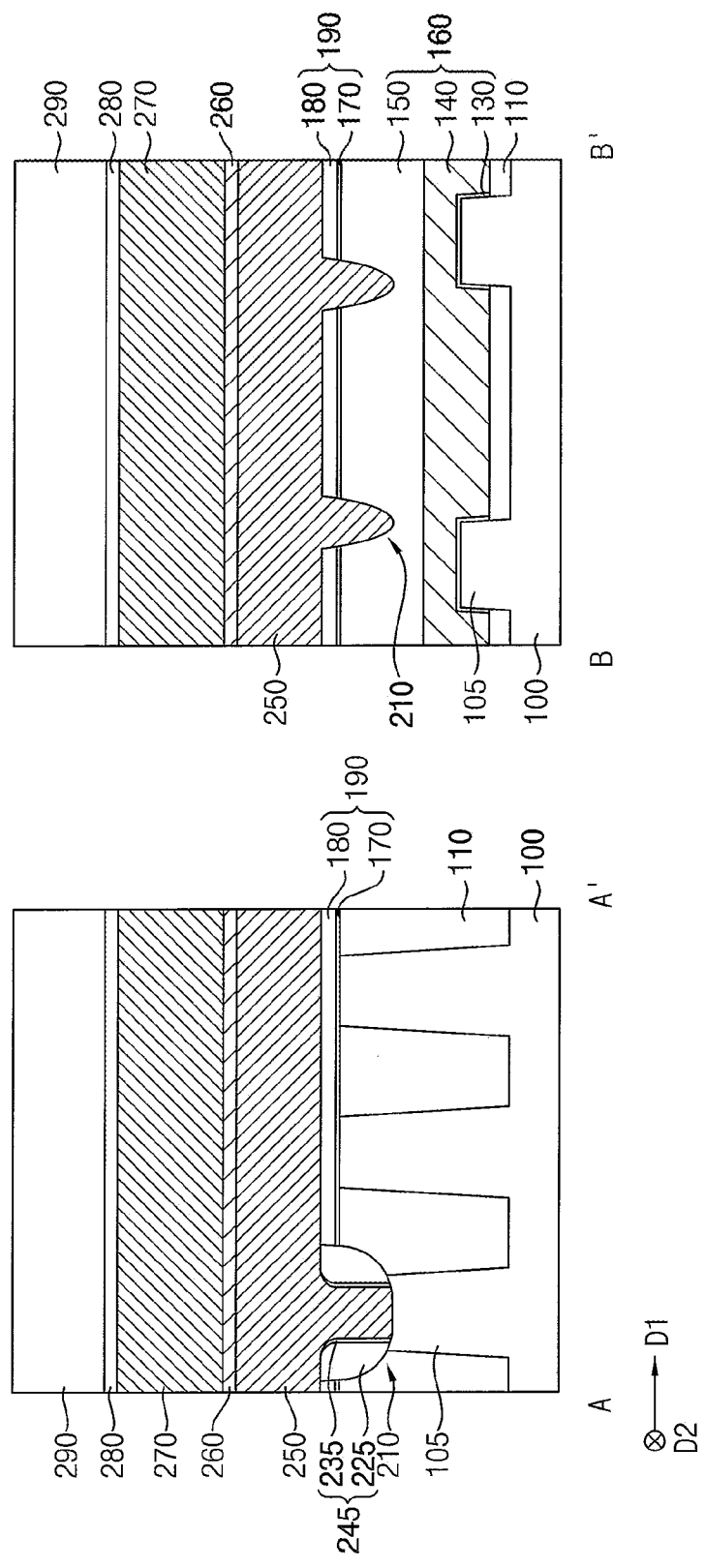

Referring to FIG. 10, after forming a first conductive layer 250 on the second insulation layer 180 to fill a remaining portion of the first hole 210, a diffusion barrier layer 260, a second conductive layer 270, and first and second capping layers 280 and 290 may be sequentially formed on the first conductive layer 250.

The first conductive layer 250 may include polysilicon doped with n-type impurities such as arsenic and/or phosphorus, and the second conductive layer 270 may include a metal, e.g., at least one of tungsten, copper, aluminum, titanium, tantalum, etc.

Figure 11:
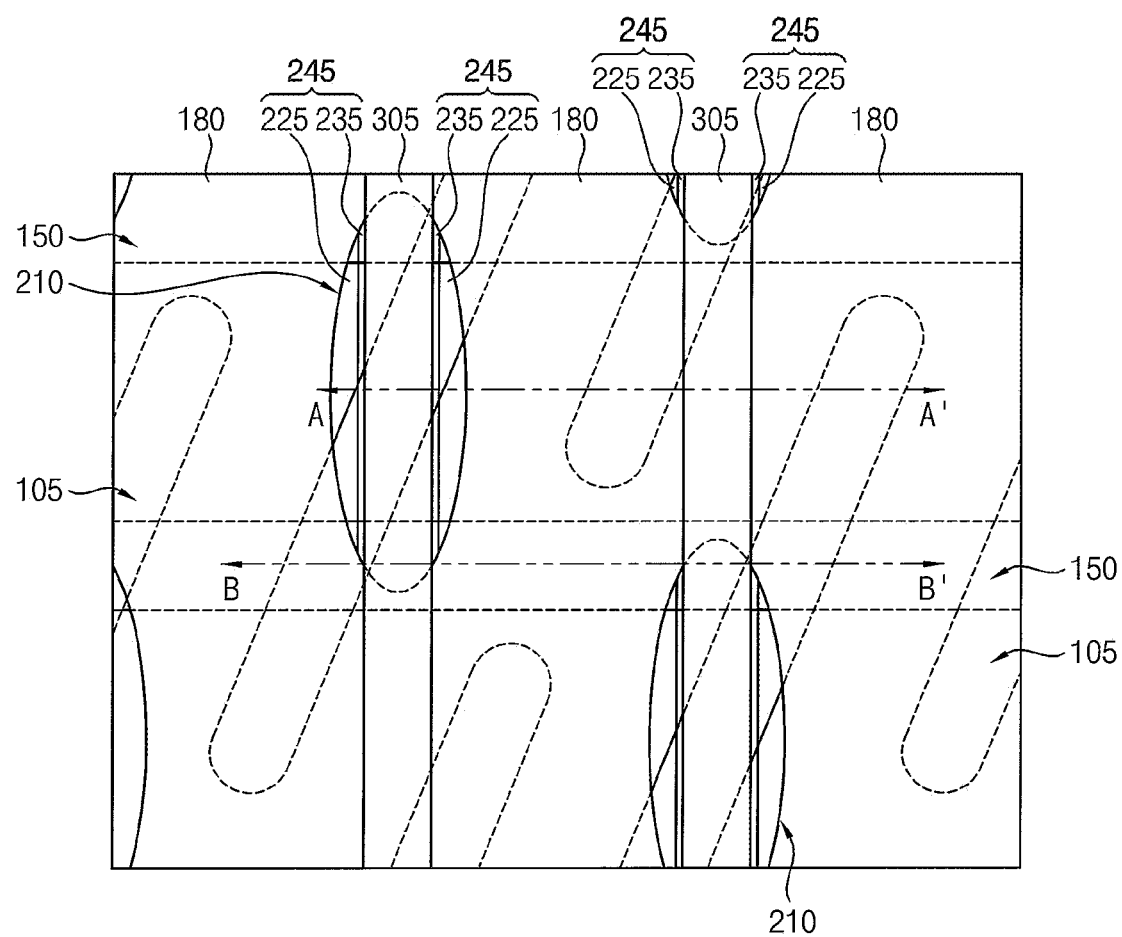
Figure 11:
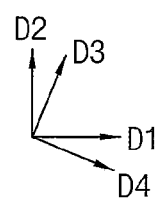
Figure 12:
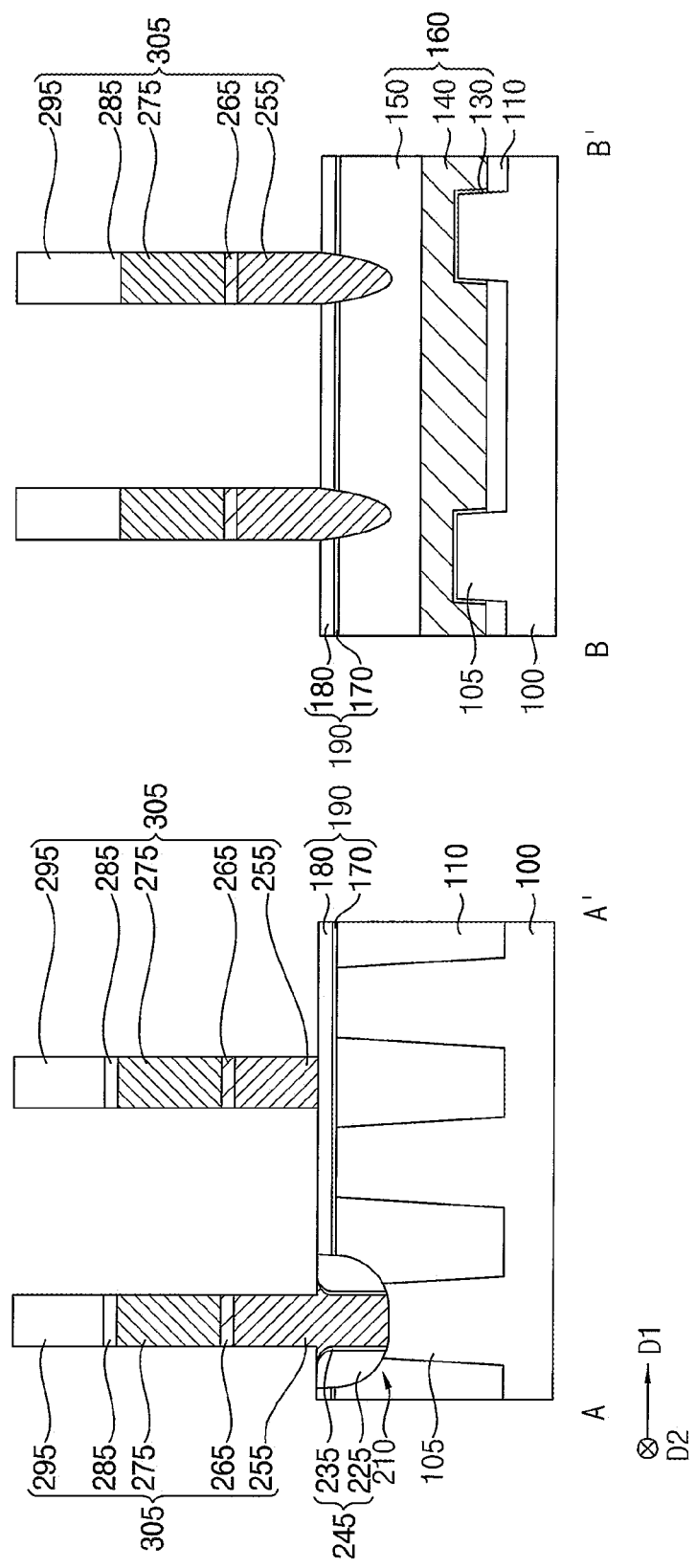

Referring to FIGS. 11 and 12, the second capping layer 290 may be patterned to form a second capping pattern 295, and the first capping layer 280, the second conductive layer 270, the diffusion barrier layer 260, and the first conductive layer 250 may be sequentially etched using the second capping pattern 295 as an etching mask.

In some example embodiments, the second capping pattern 295 may extend in the second direction on the substrate 100, and a plurality of second capping patterns 295 may be formed to be spaced apart from each other in the first direction.

By the etching process, a first conductive pattern 255, a diffusion barrier 265, a second conductive pattern 275, a first capping pattern 285, and the second capping pattern 295 sequentially stacked may be formed on the active pattern 105, the isolation pattern 110 and the upper portion of the gate mask 150 in the first hole 210, and on the second insulation layer 180 of the insulation layer structure 190 at an outside of the first hole 210.

Hereinafter, the first conductive pattern 255, the diffusion barrier 265, the second conductive pattern 275, and the first and second capping patterns 285 and 295 sequentially stacked may be referred to as a bit line structure 305.

In some example embodiments, the bit line structure 305 may extend in the second direction on the substrate 100, and a plurality of bit line structures 305 may be spaced apart from each other in the first direction. Each of the bit line structures 305 may contact (e.g. directly contact) a central portion in the third direction of each of the active patterns 105 through the first hole 210, and thus may be electrically connected thereto.

Figure 13:
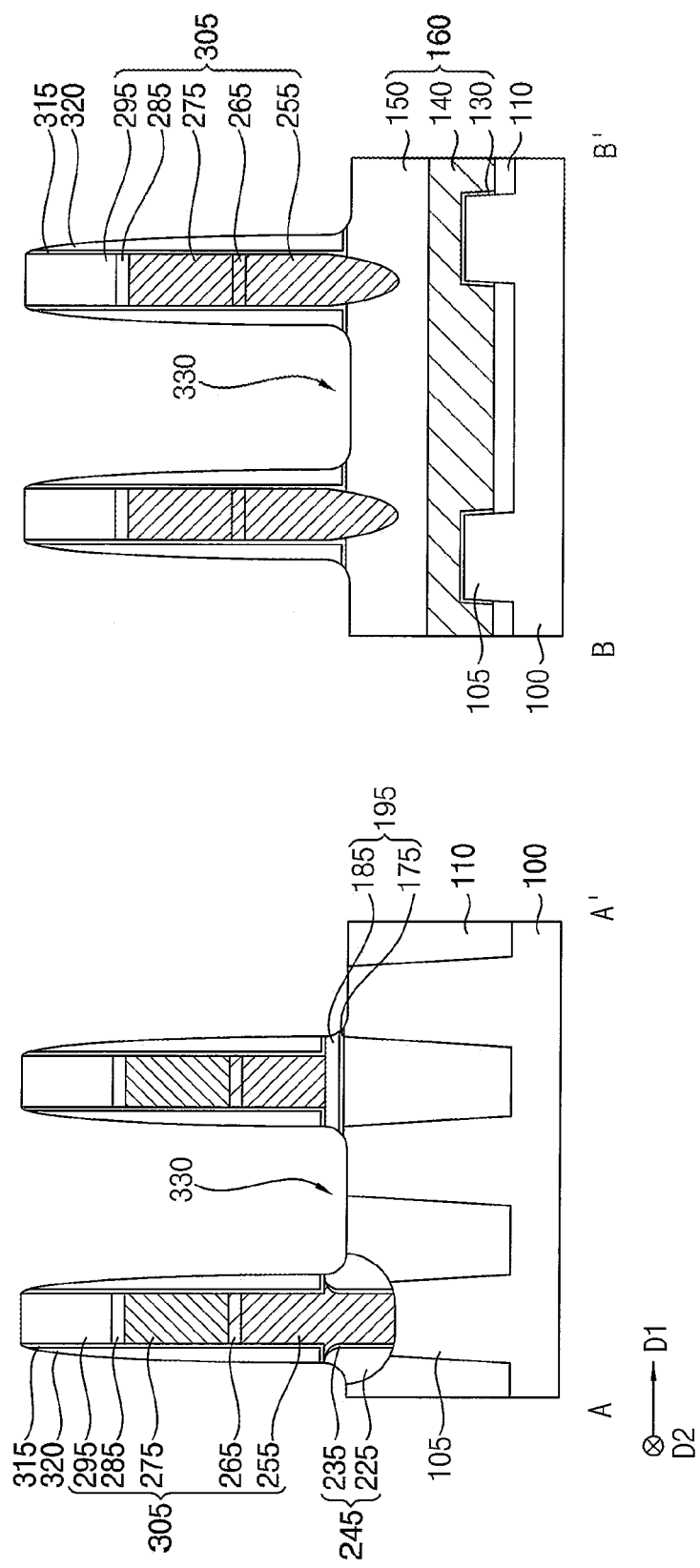

Referring to FIG. 13, first and second upper spacer layers may be formed on the first conductive pattern 255 and the second insulation layer 180 to cover the bit line structure 305.

The second upper spacer layer may be anisotropically etched to form a second upper spacer 320 on the first upper spacer layer to cover a sidewall of the bit line structure 305.

The second upper spacer layer may include, e.g., an oxide such as silicon oxide.

A dry etching process may be performed using the second capping pattern 295 and the second upper spacer 320 as an etching mask to form a first opening 330 exposing the upper surface of the active pattern 105. The upper surface of the isolation pattern 110 and the upper surface of the gate mask 150 may be also exposed by the first opening 330.

By the dry etching process, portions of the first upper spacer layer on upper surfaces of the second capping pattern 295 and the second insulation layer 180 may be removed, and thus a first upper spacer 315 covering the sidewall of the bit line structure 305 may be formed. Additionally or alternatively, during the dry etching process, the first and second insulation layers 170 and 180 may be partially removed, such that first and second insulation patterns 175 and 185 may remain under the bit line structure 305. The first and second insulation patterns 175 and 185 that are sequentially stacked under the bit line structure 305 may form an insulation pattern structure.

Figure 14:
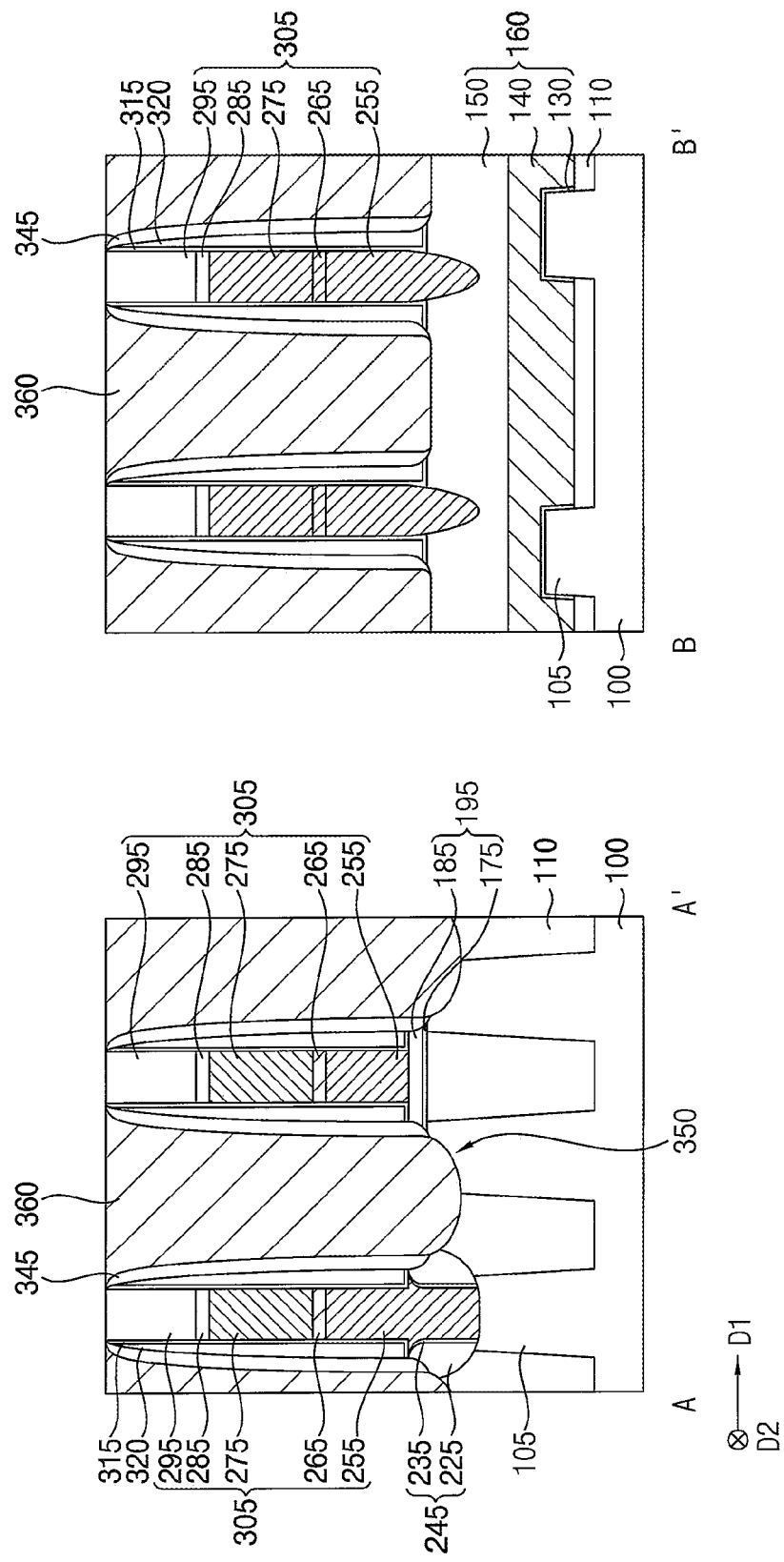

Referring now to FIG. 14, a third upper spacer layer may be formed on the upper surface of the second capping pattern 295, an outer sidewall of the second upper spacer 320, and the upper surfaces of the active pattern 105, the isolation pattern 110 and the gate mask 150 exposed by the first opening 330, and may be anisotropically etched e.g. with a dry etch process to form a third upper spacer 345 covering the sidewall of the bit line structure 305.

The first to third upper spacers 315, 320 and 345 sequentially stacked in a horizontal direction substantially parallel to the upper surface of the substrate 100 from the sidewall of the bit line structure 305 on the substrate 100 may be referred to as a preliminary upper spacer structure.

An upper portion of the active pattern 105 may be removed by an etching process to form a third recess 350 connected to the first opening 330. By the etching process, an etching byproduct and an oxide layer may be formed on the third recess 350, and a cleaning process may be performed to remove the etching byproduct and the oxide layer. In some example embodiments, the cleaning process may be performed using a cleaning solution including hydrogen fluoride (HF) such as buffered hydrogen fluoride (BHF).

When the third recess 350 is formed, the first lower spacer 225 may be exposed, and if the first lower spacer 225 includes an oxide, the first lower spacer 225 may be removed by the cleaning process. However, in some example embodiments, the first lower spacer 225 may include a material different from an oxide, e.g., a nitride such as silicon nitride, so that the first lower spacer 225 might not be removed or might not be fully removed by cleaning solution. Thus, the bit line structure 305 and a lower contact plug 365 (refer to FIGS. 15 and 16) formed thereafter may secure a sufficient separation distance by the first lower spacer 225, so that an electrical short may be prevented or reduced in likelihood of occurrence therebetween.

A lower contact plug layer 360 may be formed to fill the third recess 350 on the substrate 100 and a space between the bit line structures 305, and an upper portion of the lower contact plug layer 360 may be planarized, e.g. with a chemical mechanical planarization (CMP) process and/or with an etch-back process, until an upper surface of the second capping pattern 295 is exposed.

In some example embodiments, the lower contact plug layer 360 may extend in the second direction, and a plurality of lower contact plug layers 360 may be formed to be spaced apart from each other in the first direction by the bit line structures 305.

Figure 15:
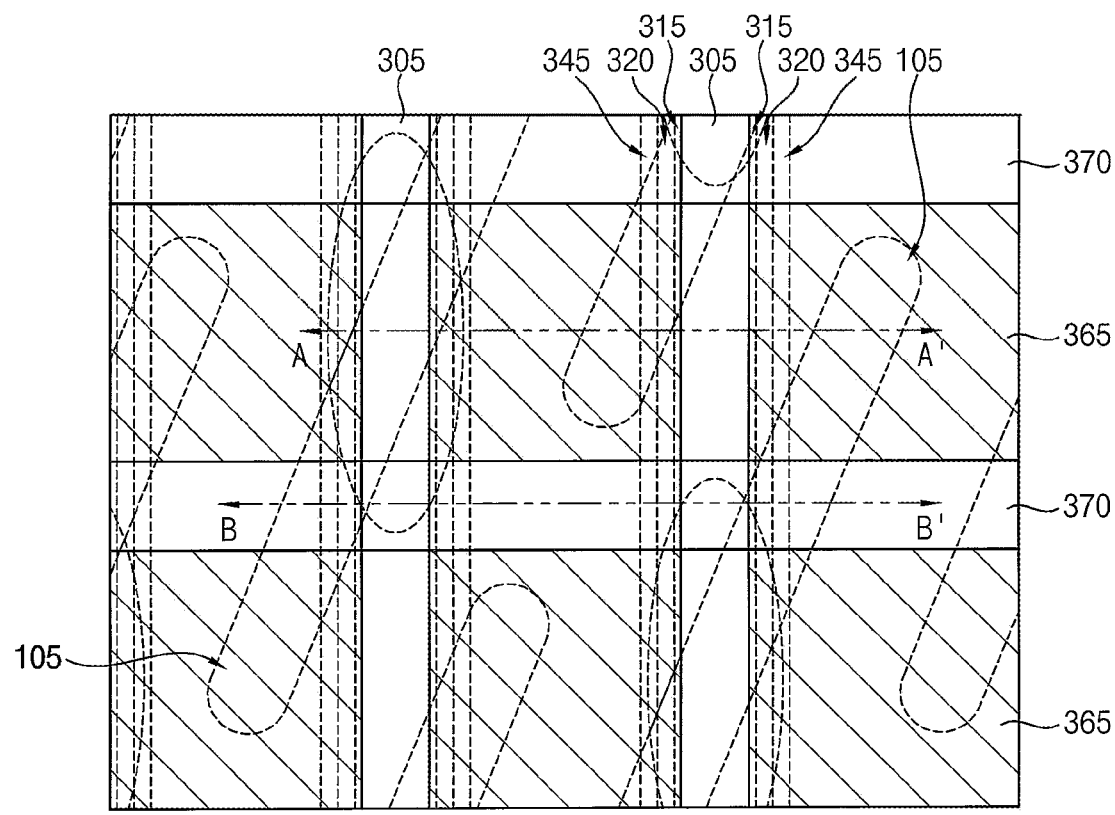
Figure 15:
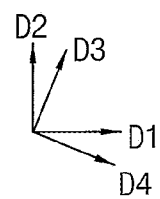
Figure 16:
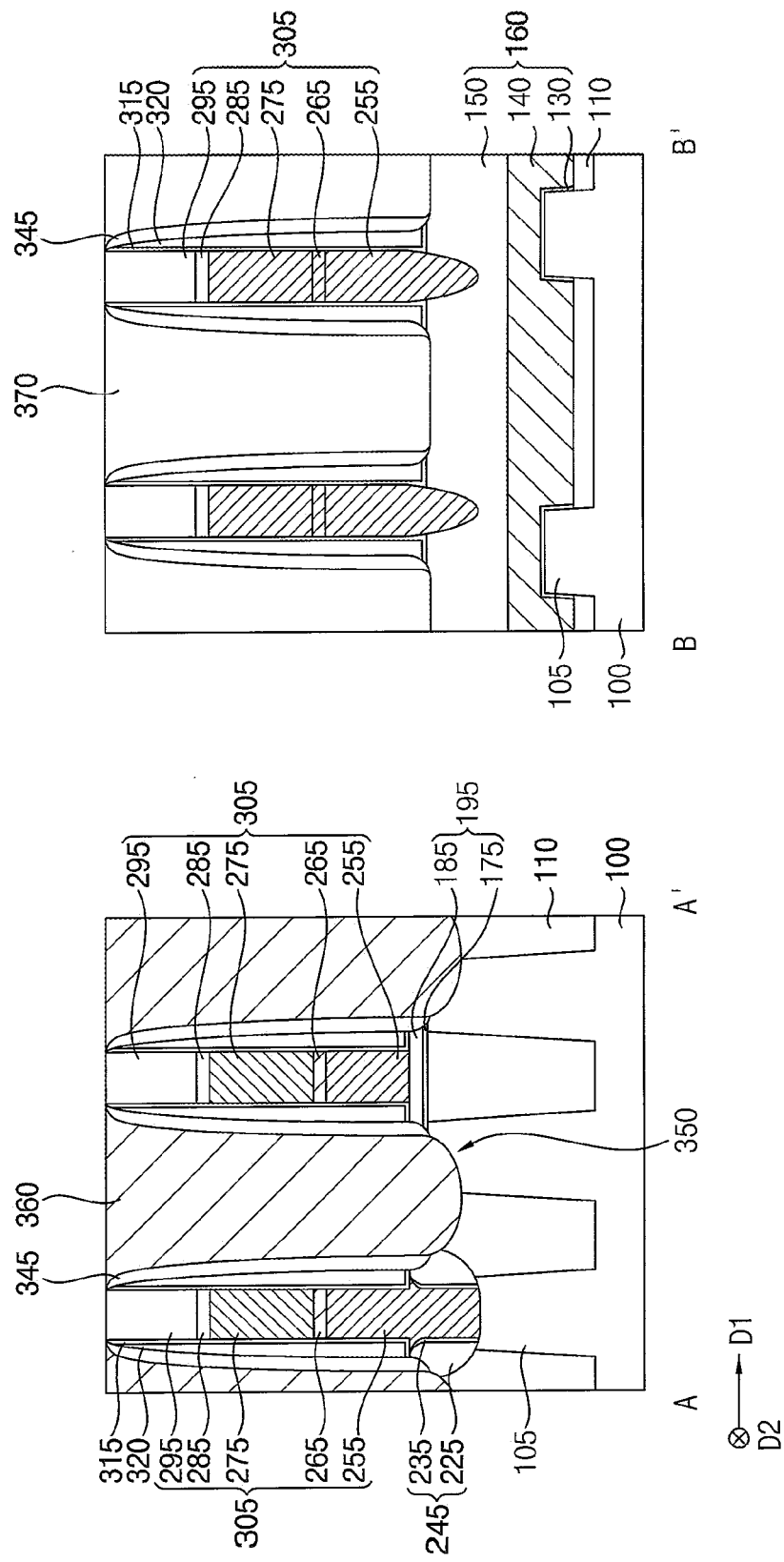

Referring to FIGS. 15 and 16, a second mask (not shown) including second openings, each of which may extend in the first direction, spaced apart from each other in the second direction may be formed on the second capping pattern 295 and the lower contact plug layer 360, and the lower contact plug layer 360 may be etched using the second mask as an etching mask.

In some example embodiments, each of the second openings may overlap the gate structure 160 in a vertical direction substantially perpendicular to the upper surface of the substrate 100. By the etching process, a third opening may be formed to expose the upper surface of the gate mask 150 of the gate structure 160 between the bit line structures 305 on the substrate 100.

After removing the second mask, a third capping pattern 370 may be formed on the substrate 100 to fill the third opening. In some example embodiments, the third capping pattern 370 may extend in the first direction between the bit line structures 305, and a plurality of third capping patterns 370 may be formed in the second direction.

Thus, the lower contact plug layer 360 extending in the second direction between the bit line structures 305 may be divided into a plurality of lower contact plugs 365 spaced apart from each other in the second direction by the third capping patterns 370. Each of the lower contact plugs 365 may contact a corresponding one of opposite ends in the third direction of a corresponding one of the active patterns 105, and may be electrically connected thereto.

Figure 17:
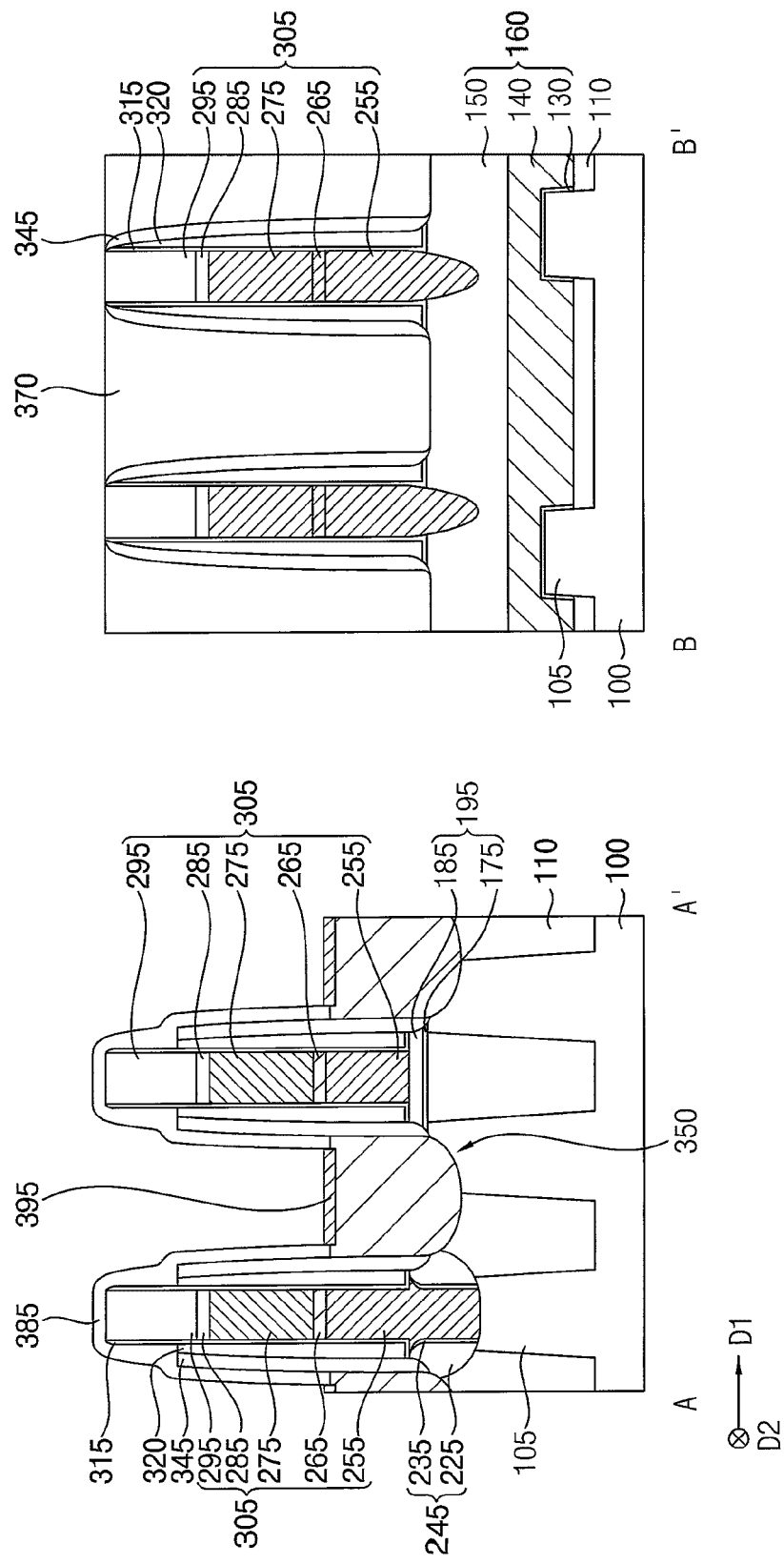

Referring to FIG. 17, an upper portion of the lower contact plug 365 may be removed to expose an upper portion of the preliminary spacer structure on the sidewall of the bit line structure 305, and upper portions of the second and third upper spacers 320 and 345 of the exposed preliminary spacer structure may be removed.

An upper portion of the lower contact plug 365 may be further removed by, e.g., a CMP process and/or an etch back process. Thus, the upper surface of the lower contact plug 365 may be lower than uppermost surfaces of the second and third upper spacers 320 and 345.

A fourth spacer layer may be formed on the bit line structure 305, the preliminary upper spacer structure, the third capping pattern 370, and the lower contact plug 365, and may be anisotropically etched so that an fourth upper spacer 385 may be formed to cover the first to third upper spacers 315, 320, 345 on each of opposite sidewalls of the bit line structure 305 in the first direction and that an upper surface of the lower contact plug 365 might not be covered by the fourth upper spacer 385 but be exposed.

An ohmic contact pattern 395 may be formed on the exposed upper surface of the lower contact plug 365. In some example embodiments, the ohmic contact pattern 395 may be formed by forming (e.g. depositing with a CVD process and/or with a physical vapor deposition (PVD) process) a metal layer on the lower contact plug 365, the fourth upper spacer 385, and the second and third capping patterns 295 and 370, thermally treating/annealing the metal layer, and removing an unreacted portion of the metal layer.

Figure 18:
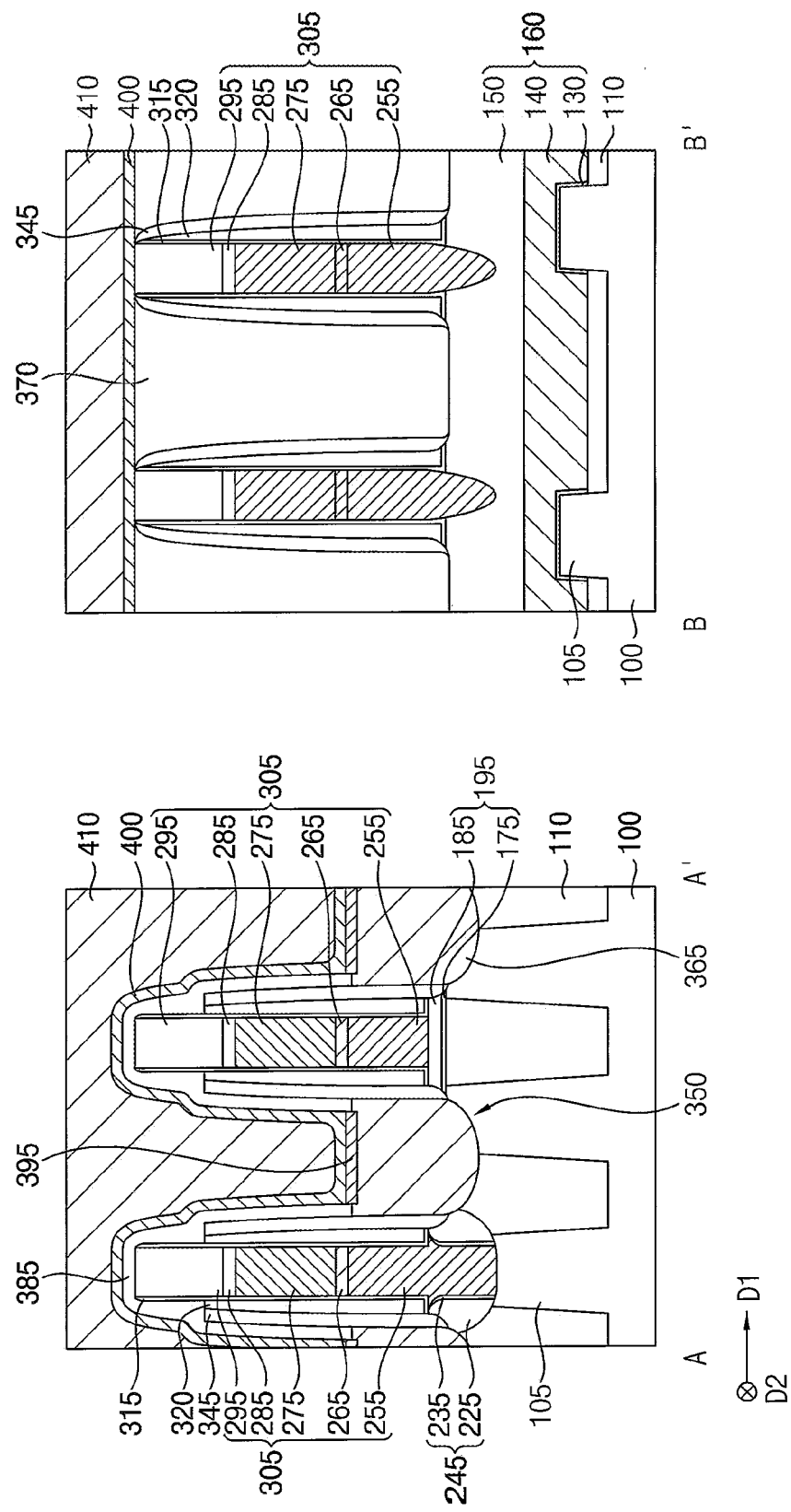

Referring to FIG. 18, a barrier layer 400 may be formed on the fourth upper spacer 385, the ohmic contact pattern 395, and the second and third capping patterns 295 and 370, an upper contact plug layer 410 may be formed on the barrier layer 400 to fill a space between the bit line structures 305, and an upper portion of the upper contact plug layer 410 may be planarized.

In some example embodiments, an upper surface of the upper contact plug layer 410 may be higher than upper surfaces of the second and third capping patterns 295 and 370.

Figure 19:
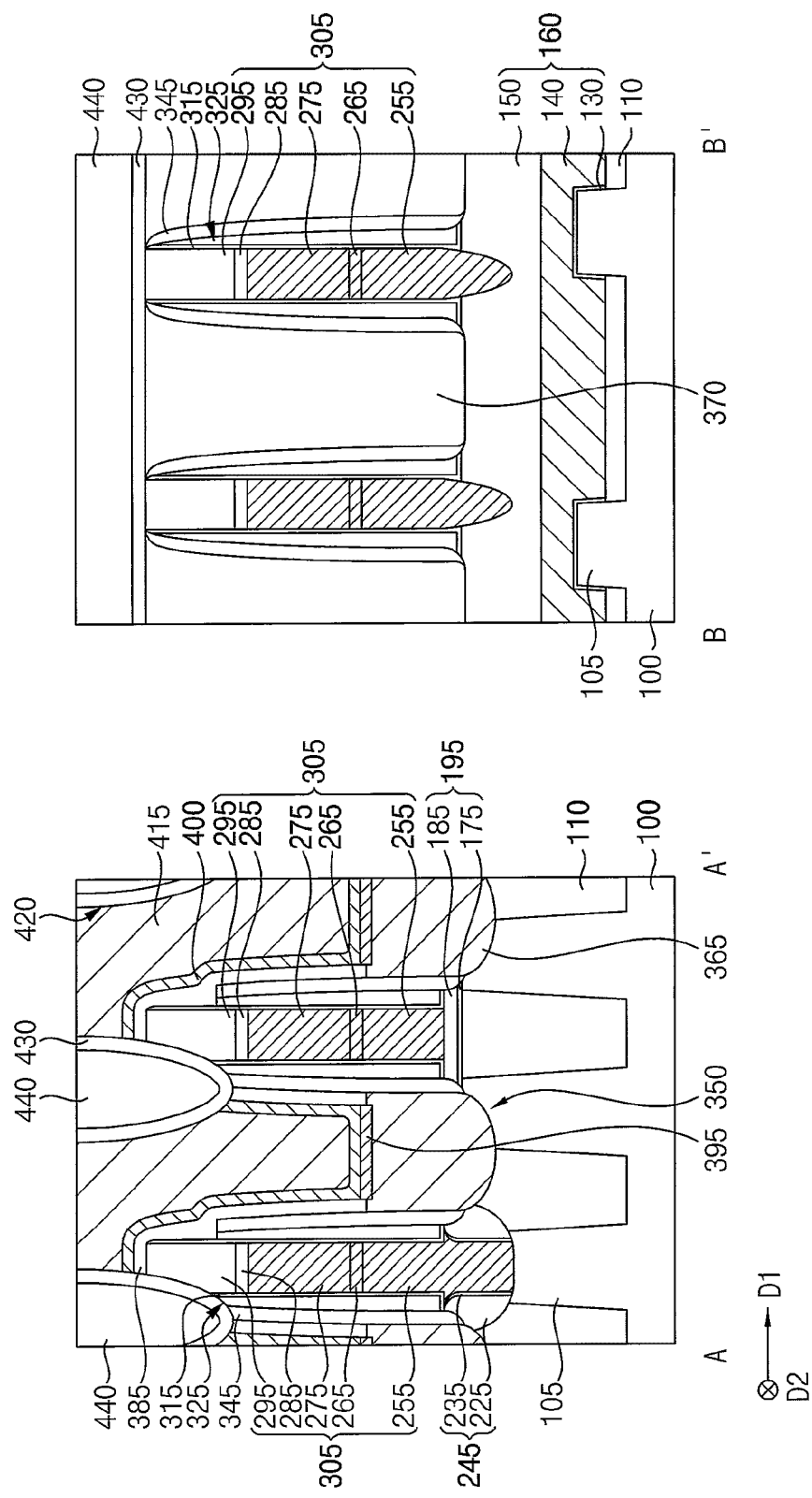

Referring to FIG. 19, an upper portion of the upper contact plug layer 410, a portion of the barrier layer 400, an upper portion of the second capping pattern 295, and upper portions of the first, third and fourth upper spacers 315, 345 and 385 may be removed to form a second hole 420, and thus an upper surface of the second upper spacer 320 may be exposed.

As the second hole 420 is formed, the upper contact plug layer 410 may be transformed into an upper contact plug 415. In some example embodiments, a plurality of upper contact plugs 415 may be formed to be spaced apart from each other in each of the first and second directions, and may be arranged in a honeycomb pattern, e.g. a hexagonal pattern such as a regular or irregular hexagonal pattern, in a plan view. Each of the upper contact plugs 415 may have a shape of a circle, ellipse, or polygon such as a rectangle or square or pentagon or triangle, in a plan view.

The lower contact plug 365, the ohmic contact pattern 395, the barrier layer 400, and the upper contact plug 415 sequentially stacked on the substrate 100 may form a contact plug structure.

The exposed second upper spacer 320 may be removed to form an air gap 325 connected to the second hole 420. The second spacer 320 may be removed by, e.g., a wet etching process.

In some example embodiments, not only a portion of the second upper spacer 320 on the sidewall of the bit line structure 305 extending in the second direction directly exposed by the second hole 420 but also other portions of the second upper spacer 320 parallel to the directly exposed portion thereof in the horizontal direction may be removed. For example, not only the portion of the second upper spacer 320 exposed by the second hole 420 not to be covered by the upper contact plug 415 but also a portion of the second upper spacer 320 adjacent to the exposed portion in the second direction to be covered by the third capping pattern 370 and a portion of the second upper spacer 320 adjacent to the exposed portion in the second direction to be covered by the upper contact plug 415 may be all removed.

First and second insulating interlayers 430 and 440 may be sequentially stacked to fill the second hole 420. The first and second insulating interlayers 430 and 440 may be also sequentially stacked on the third capping pattern 370.

The first insulating interlayer 430 may include a material having a low gap filling characteristic, and thus the air gap 325 under the second hole 420 might not be filled. The air gap 325 may be also referred to as an air spacer 325, and may form an upper spacer structure together with the first, third and fourth upper spacers 315, 345 and 385. For example, the air gap 325 may be a spacer including an air such as clean, dry air.

Referring to FIGS. 1 and 2 again, a capacitor 490 may be formed to contact the upper surface of the upper contact plug 415.

Particularly, an etch stop layer 450 and a mold layer (not shown) may be sequentially formed on the upper contact plug 415 and the first and second insulating interlayers 430 and 440, and partially etched to form a third hole partially exposing the upper surface of the upper contact plug 415.

A lower electrode layer (not shown) may be formed on a sidewall of the third hole, the exposed upper surface of the upper contact plug 415 and the mold layer, a sacrificial layer (not shown) may be formed on the lower electrode layer to fill the third hole, and the lower electrode layer and the sacrificial layer may be planarized until an upper surface of the mold layer is exposed to divide the lower electrode layer. The sacrificial layer and the mold layer may be removed by, e.g., a wet etching process, and thus a lower electrode 460 having a cylindrical shape may be formed on the exposed upper surface of the upper contact plug 415. Alternatively, the lower electrode 460 may have a pillar shape filling the third hole.

A dielectric layer 470 may be formed on a surface of the lower electrode 460 and the etch stop layer 450, and an upper electrode 480 may be formed on the dielectric layer 470 so that the capacitor 490 including the lower electrode 460, the dielectric layer 470, and the upper electrode 480 may be formed.

A third insulating interlayer 500 may be formed to cover the capacitor 490 on the substrate 100 to complete the fabrication of the semiconductor device. The third insulating interlayer 500 may include an oxide, e.g., silicon oxide.

As illustrated above, the first lower spacer 225 exposed by the third recess 350 may or might not include an oxide, and thus, when the cleaning process is performed on the third recess 350, the first lower spacer 225 may or might not be removed by the cleaning solution, so that a sufficient separation distance between the bit line structure 305 and the lower contact plug 365 may be secured. Thus, an electrical short may be prevented or reduced in likelihood of occurrence between the bit line structure 305 and the lower contact plug 365.

If the first conductive layer 250 including polysilicon doped with impurities is formed before forming the lower spacer structure 245 in the second recess 210, when the first conductive layer 250 is removed by the etching process, a portion of the first conductive layer 250 may remain on an edge of the second recess 210 in the second recess 210, and thus, bit line to buried contact disturbance (BBD) may occur between the bit line structure 305 and the lower contact plug 365. However, in some example embodiments, the lower spacer structure 245 may be formed before forming the first conductive layer 250, and the first conductive layer 250 might not remain on the edge of the second recess 210, and thus, the bit line to buried contact disturbance might not occur or may be reduced in occurring between the bit line structure 305 and the lower contact plug 365.

While inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
   an active pattern on a substrate; a gate structure buried at an upper portion of the active pattern;
   a bit line structure having a first conductive pattern, wherein a lowermost portion of the first conductive pattern is in direct contact with an upper surface of the active pattern;
   a lower spacer structure covering a lower sidewall of the bit line structure;
   a contact plug structure on the active pattern and adjacent to the bit line structure; and a capacitor on the contact plug structure,
   wherein,
   the lower spacer structure includes a first lower spacer and a second lower spacer that are sequentially stacked from the lower sidewall of the bit line structure in a horizontal direction that is parallel to an upper surface of the substrate,
   the first lower spacer includes an oxide, and contacts the lower sidewall of the bit line structure, but does not contact the contact plug structure, and
   the second lower spacer includes a material different from any of the materials of the first lower spacer.

2. The semiconductor device of claim 1, wherein the first lower spacer includes an oxide.

3. The semiconductor device of claim 1, wherein the second lower spacer includes a nitride.

4. The semiconductor device of claim 1, wherein the second lower spacer contacts the contact plug structure.

5. The semiconductor device of claim 1, further comprising:
   an isolation pattern covering the active pattern,
   wherein at least one of (a) the second lower spacer contacts the active pattern or (b) the second lower spacer contacts the isolation pattern.

6. The semiconductor device of claim 1, wherein the bit line structure includes the first conductive pattern, a diffusion barrier, a second conductive pattern, and a capping pattern that are sequentially stacked in a vertical direction that is perpendicular to the upper surface of the substrate, and
   the first conductive pattern includes polysilicon having n-type impurities.

7. The semiconductor device of claim 6, wherein the first lower spacer contacts a sidewall of the first conductive pattern.

8. The semiconductor device of claim 1, further comprising:
   an upper spacer structure covering an upper sidewall of the bit line structure.

9. The semiconductor device of claim 8, wherein the upper spacer structure includes a first upper spacer, a second upper spacer, and a third upper spacer that are sequentially stacked from the upper sidewall of the bit line structure in the horizontal direction, and
   the first upper spacer contacting the upper sidewall of the bit line structure includes a nitride.

10. The semiconductor device of claim 9, wherein the second upper spacer is an air spacer including air, and
the third upper spacer includes a nitride.

11. The semiconductor device of claim 9, wherein upper surfaces of the second and third upper spacers are lower than an upper surface of the first upper spacer.

12. A semiconductor device comprising:
an active pattern on a substrate;
a gate structure buried at an upper portion of the active pattern;
a bit line structure having a first conductive pattern, wherein a lowermost portion of the first conductive pattern is in direct contact with an upper surface of the active pattern, the bit line structure including the first conductive pattern, a diffusion barrier, a second conductive pattern, and a capping pattern that are sequentially stacked in a vertical direction that is perpendicular to an upper surface of the substrate;
a lower spacer structure covering a sidewall of at least a portion of the first conductive pattern of the bit line structure;
an upper spacer structure on the lower spacer structure, the upper spacer structure covering a sidewall of other portions of the bit line structure;
a contact plug structure on the active pattern and adjacent to the bit line structure; and
a capacitor on the contact plug structure,
wherein,
the first conductive pattern includes polysilicon having n-type impurities, and
the second conductive pattern includes a metal,
the lower spacer structure includes a first lower spacer and a second lower spacer that are sequentially stacked from the sidewall of the at least a portion of the first conductive pattern in a horizontal direction that is parallel to the upper surface of the substrate,
the first lower spacer includes an oxide, and covers the sidewall of the at least a portion of the first conductive pattern, but does not contact the contact plug structure,
the second lower spacer includes a nitride, and contacts the contact plug structure, and
the upper spacer structure contacting the sidewall of the other portions of the bit line structure includes a nitride.

13. The semiconductor device of claim 12, wherein the first lower spacer contacts the sidewall of the at least a portion of the first conductive pattern.

14. The semiconductor device according to claim 12, wherein the upper spacer structure includes a first upper spacer, a second upper spacer, and a third upper spacer that are sequentially stacked in the horizontal direction, and
the first upper spacer of the upper spacer structure contacts the sidewall of the other portions of the bit line structure.

15. The semiconductor device according to claim 14, wherein the second upper spacer is an air spacer including air, and
the third upper spacer includes a nitride.

16. A semiconductor device comprising:
an active pattern on a substrate;
a gate structure buried at an upper portion of the active pattern, the gate structure extending in a first direction that is parallel to an upper surface of the substrate;
a bit line structure extending in a second direction and contacting the active pattern on a recess on a central upper surface of the active pattern, the second direction being parallel to the upper surface of the substrate and perpendicular to the first direction, the bit line structure including a first conductive pattern, a diffusion barrier, a second conductive pattern, and a capping pattern that are sequentially stacked in a vertical direction that is perpendicular to the upper surface of the substrate;
a lower spacer structure covering a sidewall of at least a portion of the first conductive pattern of the bit line structure, the lower spacer structure including a first lower spacer and a second lower spacer that are sequentially stacked in a horizontal direction that is parallel to the upper surface of the substrate;
an upper spacer structure covering a sidewall of a portion of the bit line structure not covered by the lower spacer structure, the upper spacer structure including a first upper space, a second upper spacer, and a third upper spacer that are sequentially stacked in the horizontal direction;
a contact plug structure on a corresponding one of opposite ends of the active pattern, the contact plug structure including a lower contact plug, an ohmic contact pattern, a barrier layer and an upper contact plug sequentially stacked in the vertical direction; and
a capacitor on the contact plug structure,
wherein the first lower spacer includes an oxide, and contacts the sidewall of the at least a portion of the first conductive pattern, but does not contact the contact plug structure, and
the second lower spacer includes a material different from any of the materials of the first lower spacer.

17. The semiconductor device of claim 16, wherein the first lower spacer includes an oxide.

18. The semiconductor device of claim 16, wherein the second lower spacer includes a nitride.

19. The semiconductor device of claim 16, wherein the second lower spacer contacts the contact plug structure.

20. The semiconductor device of claim 16, further comprising:
an isolation pattern covering the active pattern,
wherein at least one of (a) the second lower spacer contacts the active pattern, or
(b) the second lower spacer contacts the isolation pattern.

* * * * *